(12) United States Patent
Worledge

(10) Patent No.: US 8,324,697 B2
(45) Date of Patent: Dec. 4, 2012

(54) SEED LAYER AND FREE MAGNETIC LAYER FOR PERPENDICULAR ANISOTROPY IN A SPIN-TORQUE MAGNETIC RANDOM ACCESS MEMORY

(75) Inventor: Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 12/815,923

(22) Filed: Jun. 15, 2010

(65) Prior Publication Data

US 2011/0303995 A1 Dec. 15, 2011

(51) Int. Cl.
*H01L 29/82* (2006.01)
(52) U.S. Cl. ............ 257/421; 257/422; 257/427; 438/3; 365/157; 365/158; 365/171; 365/173; 360/324.2
(58) Field of Classification Search .................... 257/20, 257/414, 421–427, E29.323; 438/3; 365/157–158, 365/171–173; 360/324–326
See application file for complete search history.

(56) References Cited

U.S. PATENT DOCUMENTS

| | | | |
|---|---|---|---|
| 7,313,013 B2 | 12/2007 | Sun et al. | |
| 7,457,064 B2 | 11/2008 | Nemoto et al. | |
| 7,489,541 B2 | 2/2009 | Pakala et al. | |
| 2004/0247942 A1 | 12/2004 | Wu et al. | |
| 2005/0041456 A1* | 2/2005 | Saito | 365/145 |
| 2005/0185455 A1* | 8/2005 | Huai | 365/171 |
| 2007/0096229 A1 | 5/2007 | Yoshikawa et al. | |
| 2007/0137028 A1* | 6/2007 | Carey et al. | 29/603.14 |
| 2008/0094886 A1 | 4/2008 | Ranjan et al. | |
| 2008/0253174 A1 | 10/2008 | Yoshikawa et al. | |
| 2009/0027948 A1 | 1/2009 | Ruehrig | |
| 2009/0079018 A1* | 3/2009 | Nagase et al. | 257/421 |
| 2009/0116137 A1 | 5/2009 | Takekuma et al. | |
| 2009/0218645 A1 | 9/2009 | Ranjan et al. | |
| 2009/0243008 A1 | 10/2009 | Kitagawa et al. | |
| 2010/0020592 A1 | 1/2010 | Hosotani et al. | |
| 2010/0078763 A1 | 4/2010 | Hosotani et al. | |
| 2010/0096716 A1* | 4/2010 | Ranjan et al. | 257/421 |
| 2011/0169111 A1* | 7/2011 | Hu et al. | 257/421 |

OTHER PUBLICATIONS

International Search Report; International Application No: PCT/US11/36910; International Filing Date: May 18, 2011; Date of Mailing: Aug. 26, 2011.
International Search Report—Written Opinion; International Application No: PCT/US11/36910; International Filing Date: May 18, 2011; Date of Mailing: Aug. 26, 2011.
U.S. Appl. No. 12/684,372, filed Jan. 8, 2010.

(Continued)

*Primary Examiner* — Bradley K Smith
*Assistant Examiner* — Jami M Valentine
(74) *Attorney, Agent, or Firm* — Cantor Colburn LLP; Vazken Alexanian

(57) ABSTRACT

A magnetic layer that includes a seed layer comprising at least tantalum and a free magnetic layer comprising at least iron. The free magnetic layer is grown on top of the seed layer and the free magnetic layer is perpendicularly magnetized. The magnetic layer may be included in a magnetic tunnel junction (MTJ) stack.

3 Claims, 9 Drawing Sheets

OTHER PUBLICATIONS

J.H. Jung et al., "Strong perpendicular magnetic anisotropy in thick CoFeB films sandwiched by Pd and MgO layers," Applied Physics Letters, 2010, 3 pgs, vol. 96, American Institute of Physics.

K. Mizunuma et al., "MgO barrier-perpendicular magnetic tunnel junctions with CoFe/Pd multilayers and ferromagnetic insertion layers," Applied Physics Letters, 2009, 3 pgs., vol. 95, American Institute of Physics.

S. Ikeda et al., "Tunnel magnetoresistance of 604% at 300 K by suppression of Ta diffusion in CoFeB/MgO/CoFeB pseudo-spin-valves annealed at high temperature," Applied Physics Letter, 2008, 3 pgs. vol. 93, American Institute of Physics.

Office Action—Non Final for U.S. Appl. No. 12/684,372; filed Jan. 8, 2010; First named Inventor: Guohan Hu; Mail Date: Dec. 16, 2011.

* cited by examiner

SEED LAYER AND FREE MAGNETIC LAYER FOR PERPENDICULAR ANISOTROPY IN A SPIN-TORQUE MAGNETIC RANDOM ACCESS MEMORY

BACKGROUND

The present invention relates to magnetic random access memory, and more specifically, to materials optimized for spin-torque memory having a seed layer and free magnetic layer for perpendicular anisotropy.

A spin torque magnetic random access memory (MRAM) device uses a two terminal spin-torque based memory element including a pinned layer, a tunnel barrier layer and a free layer in a magnetic tunnel junction (MTJ) stack as shown in FIGS. 1 and 2. For example, in FIG. 1, a MTJ stack 10 includes a pinned layer 12, a tunnel barrier layer 14 and a free magnetic layer 16. The magnetization of the pinned layer 12 is fixed in a direction (e.g., in a horizontal direction to the right as shown in FIG. 1 or in a vertically direction pointing up as shown in FIG. 2). The current passing up through the MTJ stack 10 makes the free magnetic layer 16 parallel to pinned layer 12, while a current passing down through the MTJ stack 10 makes the free magnetic layer 16 anti-parallel to the pinned layer 12. A smaller current (of either polarity) is used to read the resistance of the device, which depends on the relative orientations of the free layer 16 and pinned layer 12. As shown in FIG. 1, the free magnetic layer 16 and pinned layer 12 have their magnetizations lie in the plane which may lead to high switching currents.

FIG. 2 is an example of a MTJ stack 20 that includes a pinned layer 22, a tunnel barrier layer 24 and a free magnetic layer 26 where the magnetizations of the free magnetic layer 26 and pinned layer 22 are perpendicular to the plane. The layers 22 and 26 have perpendicular magnetic anisotropy (PMA). Some problems associated with the MTJ stack 20 include that there is a minimal number of magnetic materials with perpendicular anisotropy, and these materials have fundamental problems for use in spin-torque MRAM devices. For example, some materials have low magnetoresistance (MR) with a tunnel barrier layer of the MTJ stack and others have to be grown at high temperatures e.g., 500 C.

SUMMARY

The present invention provides magnetic tunnel junction (MTJ) stacks of optimal material choices which have perpendicular magnetic anisotropy (PMA) and provide high magnetoresistance (MR) with a tunnel barrier layer of the MTJ stack and can be grown at room temperature.

According to an embodiment of the present invention a magnetic layer is provided. The magnetic layer includes a seed layer comprising at least tantalum and a free magnetic layer comprising at least iron. The free magnetic layer is grown on top of the seed layer and the free magnetic layer is perpendicularly magnetized.

According to one embodiment of the present invention, a MTJ stack is provided. The MTJ stack includes a seed layer comprising at least tantalum and a free magnetic layer comprising at least iron. The free magnetic layer is grown on top of the seed layer and the free magnetic layer is perpendicularly magnetized.

According to another embodiment of the present invention, a spin-torque based magnetic random access memory (MRAM) device is provided. The spin-torque based MRAM device includes a MTJ stack including a seed layer comprising tantalum and a free magnetic layer comprising at least iron. The free magnetic layer is grown on top of the seed layer and the free magnetic layer is perpendicularly magnetized.

According to yet another embodiment of the present invention, a spin-torque MRAM device is provided. The spin-torque based MRAM includes a multi-layer MTJ stack that includes a plurality of seed layers each comprising tantalum and a plurality of free magnetic layers comprising at least iron wherein each free magnetic layer of the plurality of free magnetic layers is grown on top of each seed layer of the plurality of seed layers in a stacked manner and each free magnetic layer of the plurality of free magnetic layers is perpendicularly magnetized.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
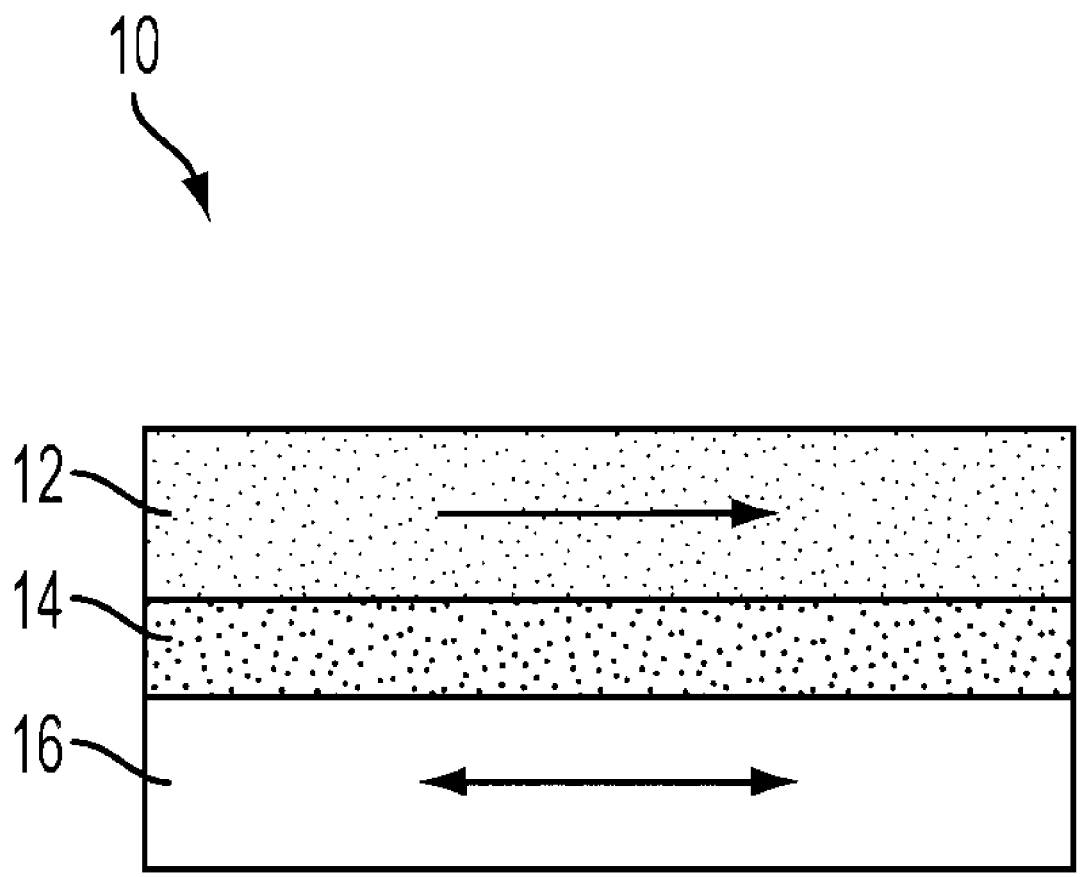
FIGS. 1 and 2 are diagrams illustrating conventional magnetic tunnel junction (MTJ) stacks.
Figure 2:
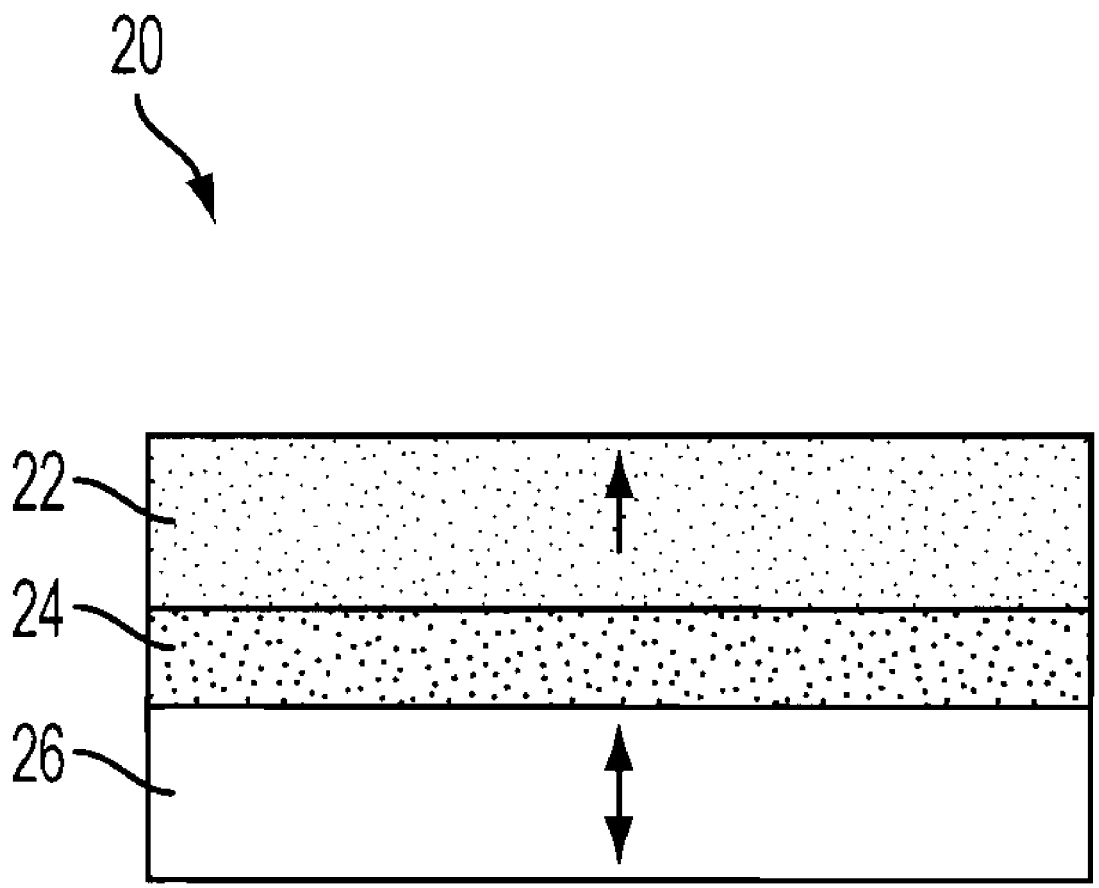
Figure 3:
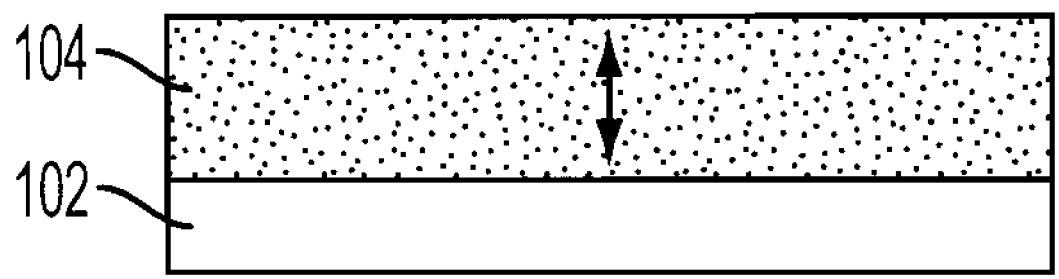
FIG. 3 is a diagram illustrating a seed layer and a free magnetic layer of an MTJ stack that can be implemented within embodiments of the present invention.
Figure 8:
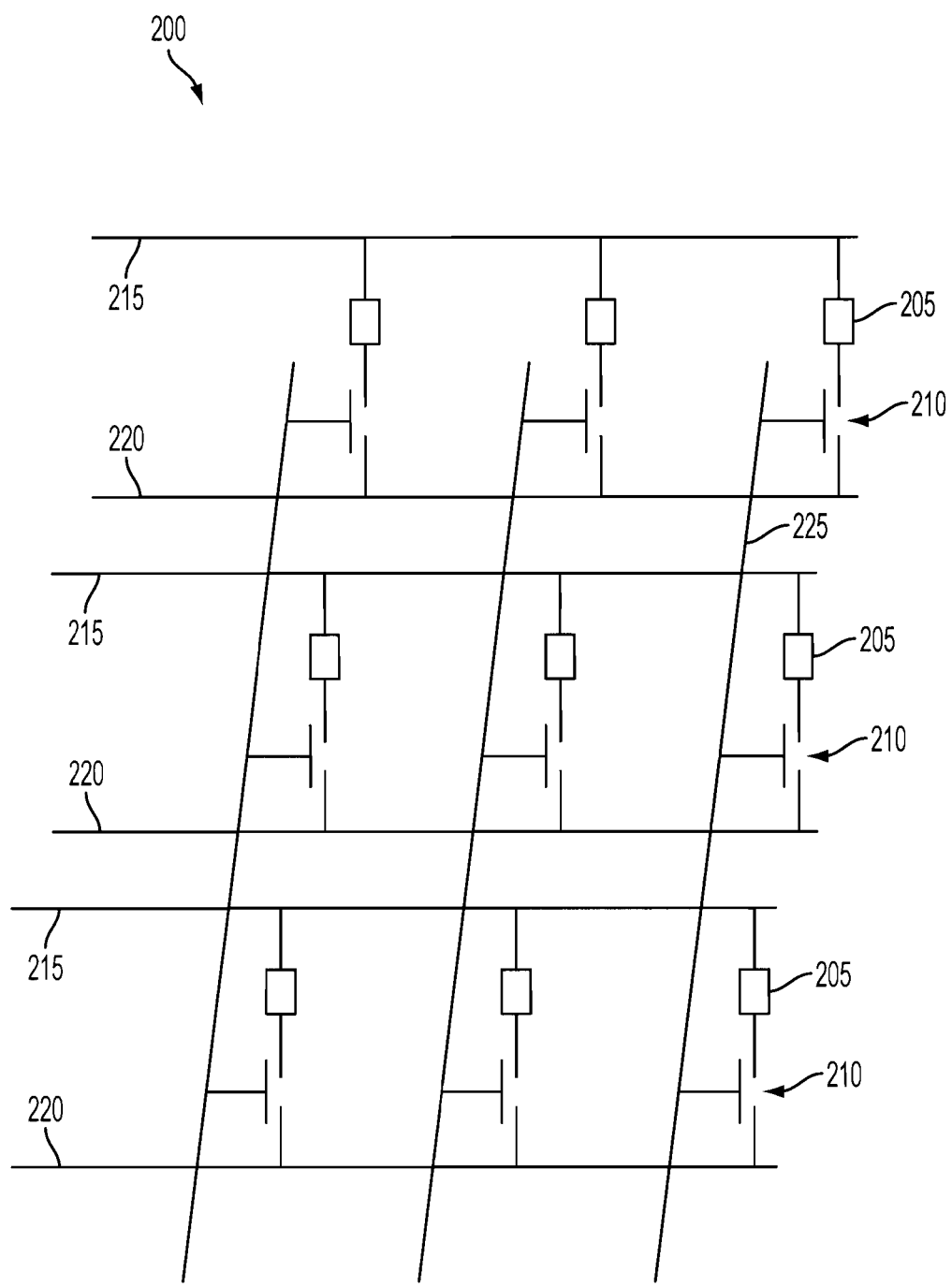
FIG. 8 is a diagram illustrating a magnetic random access memory (MRAM) device including MTJ stacks that can be implemented within embodiments of the present invention.

With reference now to FIG. 3, a magnetic layer is provided. As shown in FIG. 3, the magnetic layer may include a seed layer 102 comprises at least tantalum. Alternatively, the seed layer 102 may comprise tantalum and magnesium (Mg) wherein the Mg is less than 50% of the composition. The magnetic layer further includes a free magnetic layer 104 comprising at least iron (Fe). According to an embodiment of the present invention, the free magnetic layer 104 is grown on top of the seed layer 102 and the free magnetic layer 104 is perpendicularly magnetized. According to an embodiment of the present invention the magnetic layers shown in FIG. 3, may be included in an MTJ stack as depicted in FIG. 8, for example. According to an embodiment of the present invention, the seed layer 102 comprises at least 80% tantalum and the free magnetic layer 104 comprises at least 10% iron. Further, the seed layer 102 is of a predetermined thickness ranging from approximately 0.5 nanometers (nm) to approximately 3 nanometers (nm).

According to an embodiment of the present invention, the free magnetic layer 104 may further include at least one of cobalt (Co) and boron (B). Therefore, the free magnetic layer may include CoFeB, for example. The CoFeB may be of a variety of compositions. For example, the CoFeB composition may include 60% of Co, 20% of Fe and 20% of B. According to an embodiment of the present invention, Co is less than approximately 90% of the composition of the free magnetic layer 104. The composition range of the Fe is between 10% and 100%; and the B is less than approximately 40% of the composition of the free magnetic layer 104. The present invention is not limited to the use of CoFeB; other suitable elements may be utilized. According to an embodiment of the present invention, a predetermined thickness of the free magnetic layer 104 ranges from approximately 0.5 nanometers (nm) to approximately 1.5 nanometers (nm).

The present invention discloses examples of optimal MTJ stack material choices that provide switching characteristics required for integrated memory applications of a spin-torque switched MTJ. For example, according to one embodiment of the present invention, the free magnetic layer 104 has a high magnetoresistance (MR). According to another embodiment of the present invention, the free magnetic layer 104 is in a body-centered cubic (BCC) structure. According to another embodiment of the present invention, the free magnetic layer 104 is not in the L10 crystal structure (i.e., phase).

Figure 4:
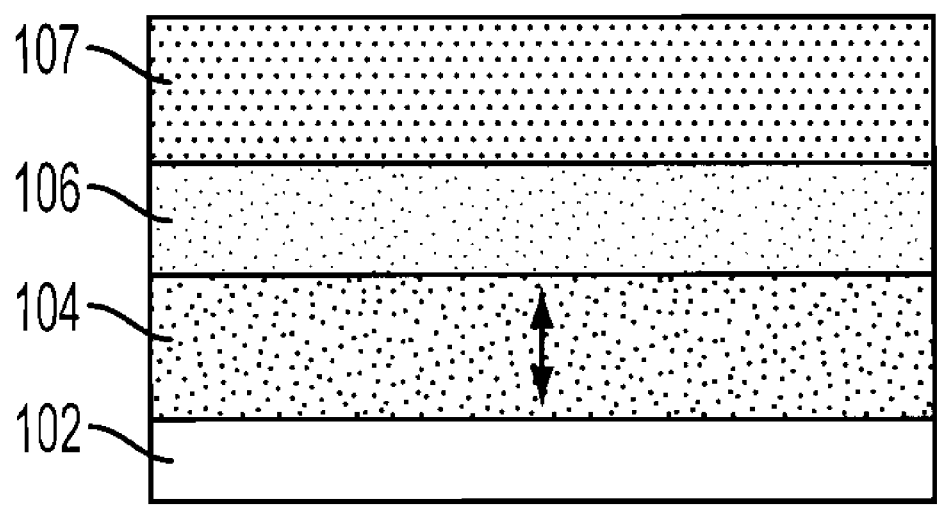
FIG. 4 is a diagram illustrating the MTJ stack shown in FIG. 3 including a tunnel barrier layer that can be implemented within alternative embodiments of the present invention.

According to an embodiment of the present invention, a tunnel barrier layer is formed on top of the free magnetic layer 104 and will now be described with reference to FIG. 4. As shown in FIG. 4, a tunnel barrier layer 106 is formed on the free magnetic layer 104. The tunnel barrier layer 106 is formed of magnesium oxide (MgO) for example. The tunnel barrier layer 106 adds anisotropy to an MTJ stack. According to another embodiment of the present invention, a fixed pinned layer 107 may be grown on top of the tunnel barrier layer 106.

Figure 5:
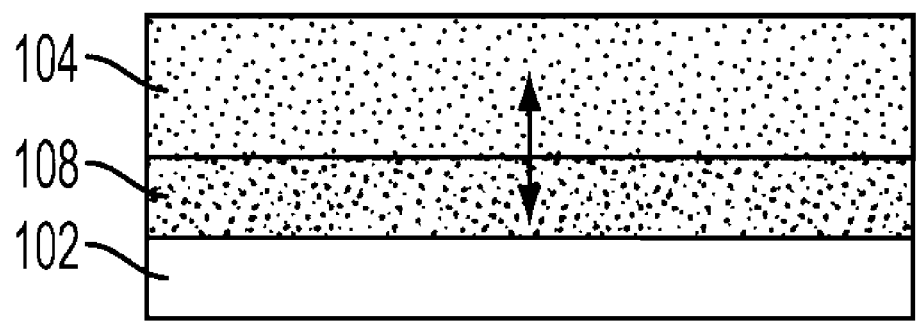
FIG. 5 is a diagram illustrating a first interface material layer of iron formed between the seed layer and the free magnetic layer of a MTJ stack that can be implemented within embodiments of the present invention.

Further, according to the current embodiment of the present invention, an interface layer may be grown between the seed layer 102 and the free magnetic layer 104 as shown in FIG. 5. In FIG. 5, an interface layer 108 comprising a thin layer of Fe is provided. According to an embodiment of the present invention, the interface layer 108 is formed of a predetermined thickness of less than 0.5 nanometers (nm). According to an embodiment of the present invention, the seed layer 102 may include approximately 2 nanometers (nm) of tantalum; the interface layer 108 may include approximately 0.3 nanometers (nm) of iron; and the free magnetic layer 104 may include approximately 0.7 nanometers (nm) of CoFeB. According to an embodiment of the present invention, the interface layer 108 may be a first interface layer. An additional interface layer (e.g., a second interface layer) may be included in an MTJ stack as discussed below with reference to FIG. 6.

Figure 6:
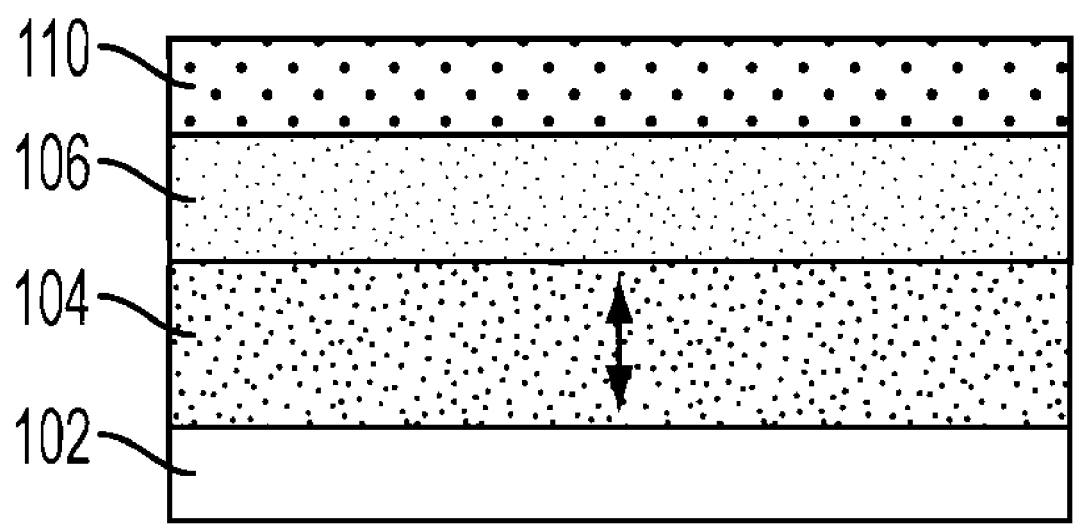
FIG. 6 is a diagram illustrating a second interface layer of iron formed on the tunnel barrier layer that can be implemented within embodiments of the present invention.

As shown in FIG. 6, according to another embodiment of the present invention, a second interface layer 110 formed of a thin layer of Fe may also be provided to add to the anisotropy of the free layer-tunnel barrier layer interface. The second interface layer 110 may be of a predetermined thickness less than or equal to approximately 0.5 nanometers (nm). According to an embodiment of the present invention, the MTJ stack 100 may include a seed layer 102 of approximately 2 nanometers (nm) of Ta; a first interface layer of approximately 0.3 nanometers (nm) of Fe; a free magnetic layer of approximately 0.7 nanometers of CoFeB; an MgO tunnel barrier layer and a second interface layer 110 of approximately 0.5 nanometers (nm) of Fe. A fixed pinned layer such as layer 107 shown in FIG. 4, may be grown on top of second interface layer 110. The pinned magnetic layer may be formed of Co|Pd or Co|Pt multilayers, for example. The pinned magnetic layer may be formed of at least one of Pt or palladium (Pd), and at least one of CoFe or cobalt (Co).

Figure 7:
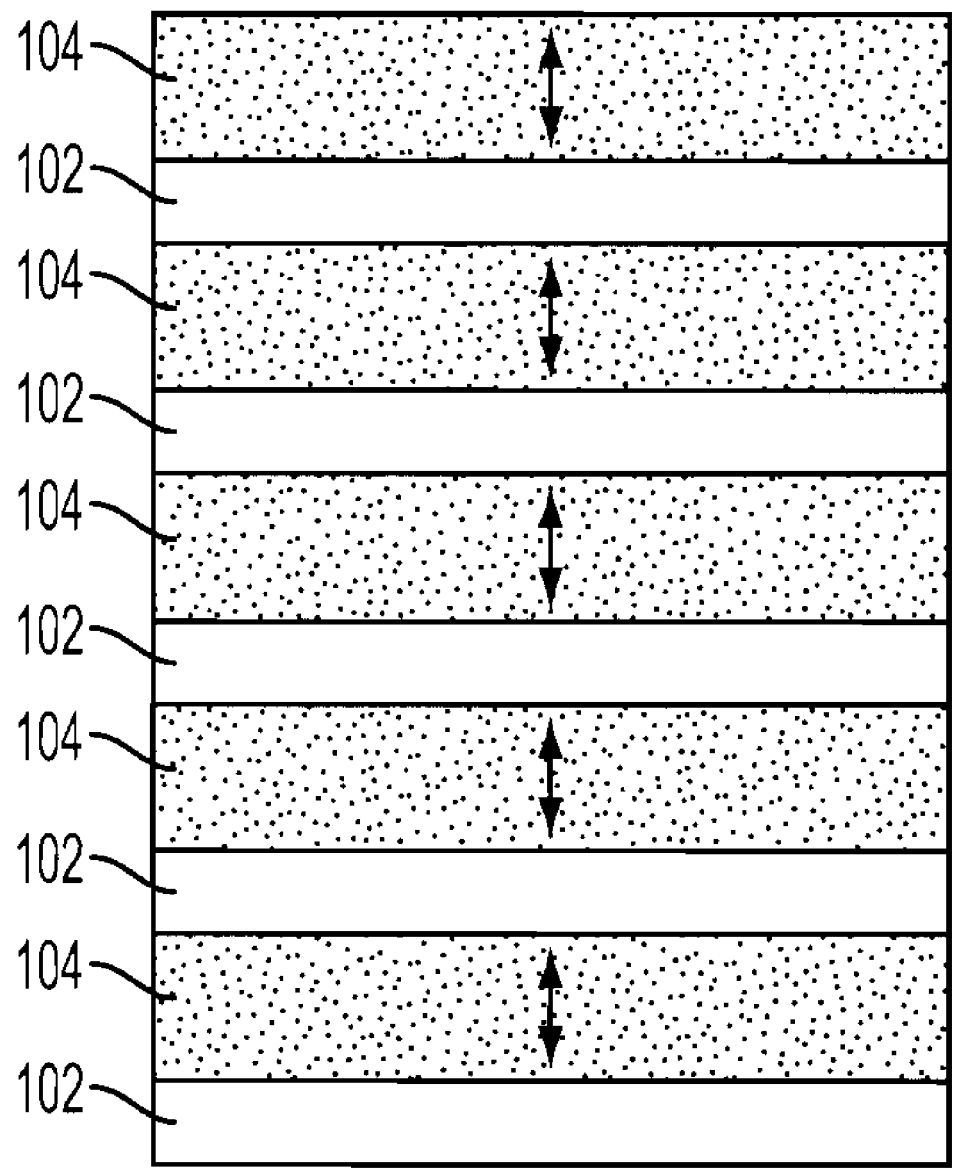
FIG. 7 is a diagram illustrating a multilayer MTJ stack that can be implemented within embodiments of the present invention.

According to an embodiment of the present invention, a multilayer MTJ stack may be implemented within embodiments of the present invention when a thicker perpendicular magnetic layer is desired as discussed below with reference to FIG. 7. In FIG. 7, a plurality of seed layers 102 each comprising tantalum, for example, is provided. Further, a plurality of free magnetic layers 104 is also provided. Each free magnetic layer 104 of the plurality of free magnetic layers 104 is grown on top of each seed layer 102 of the plurality of seed layers 102 in a stacked manner. Each free magnetic layer 104 of the plurality of free magnetic layers 104 is perpendicularly magnetized. According to an embodiment of the present invention, each seed layer 102 of the plurality of seed layers 102 is of a predetermined thickness ranging from approximately 0.2 nanometers (nm) to approximately 2 nanometers (nm). Each free magnetic layers 104 of the plurality of free magnetic layers 104 includes at least iron. The layers 104 may further include at least one of cobalt and boron, for example, layers 104 may include CoFeB. The multi-layer stack may include more than two free magnetic layers 104 as shown. The seed layers 102 may include tantalum magnesium and the combination may be formed of approximately 2.0 nanometers (nm) of TaMg|{0.6 nm Fe|0.3 nm of TaMg}×N|0.6 nm Fe, where N is a positive integer.

FIG. 8 is a diagram illustrating a spin-torque based magnetic random access memory (MRAM) device having a plurality of MTJ stacks that can be implemented within embodiments of the present invention. As shown in FIG. 8, the spin-torque based MRAM device 200 includes a plurality of MTJ stacks 205. According to an embodiment of the present invention, the MTJ stacks 205 comprise the MTJ stack materials as shown in FIGS. 3 through 7. Each MTJ stack 205 is connected in series to a transistor 210. Each MTJ stack 205 and the transistor 210 are connected together between a bit line 215 and a bit line complement 220. Further, each transistor 210 is connected at a gate thereof to a word line 225. During a write operation, the spin-polarized electrons exert a torque on a free magnetic layer of the MTJ stack 205, which can switch the polarity of the free magnetic layer. During a read operation, a current is used to detect the resistance/logic state of the MTJ stack 205. Each respective transistor 210 is switched on for both read and write operations to allow current to flow through the respective MTJ stack 205, so that the logic state can be read or written.

Figure 9:
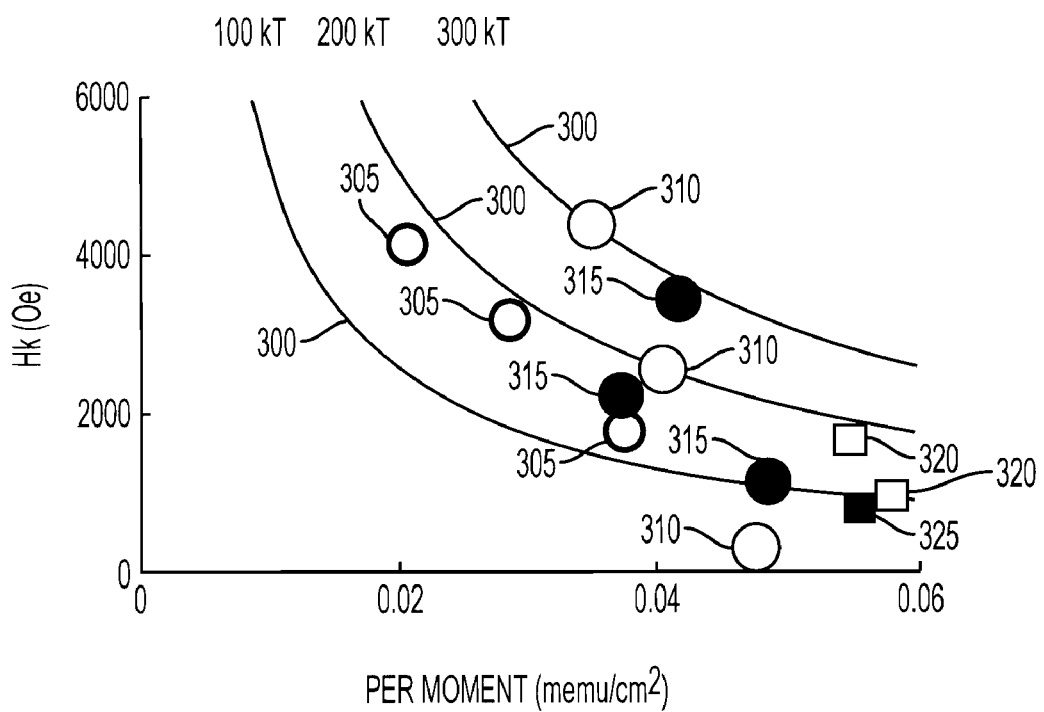
FIG. 9 is a graph illustrating the magnetic moment per unit area of the free magnetic layer and the anisotropy field (Hk) of the free magnetic layer.

FIG. 9 is a graph illustrating the magnetic moment per unit area of the free magnetic layer and the anisotropy field (Hk) of the free magnetic layer. The anisotropy field Hk is the in-plane field required to force the moment into the plain. The solid lines 300 indicate constant activation energy, proportional to the product of moment and anisotropy. The thickness of the free magnetic layer 102 may vary and directly affect the magnetic moment. For example, a plurality of shapes 305 through 325, each represent MTJ stacks having free magnetic layers of different thicknesses. For example, the shape 305 represents an MTJ stack having a composition of 20 Ta|X CoFeB|10MgO|3Fe|50 TaN where X is equal to 8, 9 or 10.

The shape 310 represents an MTJ stack having a composition of 20 Ta|2Fe|X CoFeB|10 MgO|3Fe|50 TaN where X is equal to 7, 8 or 9. The shape 315 represents an MTJ stack having a composition of 20 Ta|3Fe|X CoFeB|10 MgO|3Fe|50 TaN where X is equal to 6, 7 or 8. The shape 320 represents an MTJ stack having a composition of 20 Ta|3Fe|X CoFeB|3Ta|3Fe|6CoFeB|10 MgO|3Fe|50 TaN where X is equal to 6 or 8. The shape 325 represents an MTJ stack having a composition of 20 Ta|3Fe|3 CoFeB|3Fe|3Ta|3Fe|6CoFeB|10MgO|3Fe|50 TaN. According to an embodiment of the present invention, as the thickness of the free magnetic layer 104 increases the moment increases, as shown in FIG. 9. In these examples of the present invention, the 3Fe layer above the MgO tunnel barrier layer 106 is a non-magentic layer and is used to obtain an accurate PMA on the free magnetic layer 104 (which depends on the oxidation condition of the MgO tunnel barrier layer 106). According to another embodiment of the present invention, a MTJ stack may be provided having a Co|Pd or Co|Pt multi-layer above the 3Fe layer.

The MTJ stack materials of embodiments of the present invention have perpendicular magnetic anisotropy (PMA) and provide high magnetoresistance (MR) with a tunnel barrier layer of the MTJ stack and can be grown at room temperature. For example, the MTJ stack materials include a seed layer including tantalum and a free magnetic layer comprising at least iron.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A spin-torque magnetic random access memory (MRAM) device comprising:
   a multi-layer magnetic tunnel junction stack (MTJ) comprising:
   a plurality of seed layers each comprising at least tantalum; and
   a plurality of free magnetic layer comprising at least iron wherein each free magnetic layer of the plurality of free magnetic layers is grown on top of each seed layer of the plurality of seed layers in a stacked manner, and each free magnetic layer of the plurality of free magnetic layers is perpendicularly magnetized relative to the surface of the plurality of seed layers.

2. The spin-torque MRAM device of claim 1, wherein a predetermined thickness of each seed layer of the plurality of seed layers ranges from approximately 0.2 to approximately 2 nanometers (nm).

3. The spin-torque MRAM device of claim 1, wherein each free magnetic layer of the plurality of free magnetic layers further comprises at least one of cobalt and boron and is of a predetermined thickness of ranging from approximately 0.2 nm to 1.5 nm.

* * * * *